United States Patent
Gybin

(12) 
(10) Patent No.: US 6,248,498 B1
(45) Date of Patent: Jun. 19, 2001

(54) PHOTOSENSITIVE RESIN COMPOSITION

(75) Inventor: Alexander S. Gybin, Duluth, MN (US)

(73) Assignee: The Chromaline Corporation, Duluth, MN (US)

( * ) Notice: Subject to any disclaimer, the term of this patent is extended or adjusted under 35 U.S.C. 154(b) by 0 days.

(21) Appl. No.: 09/455,997

(22) Filed: Dec. 7, 1999

Related U.S. Application Data

(60) Provisional application No. 60/111,366, filed on Dec. 8, 1998.

(51) Int. Cl.[7] .................................................... G03F 7/021
(52) U.S. Cl. .................. 430/176; 430/281.1; 430/288.1; 430/909; 525/59
(58) Field of Search ................................ 430/176, 281.1, 430/909, 288.1; 525/59

(56) References Cited

U.S. PATENT DOCUMENTS

| | | | |
|---|---|---|---|
| 4,925,770 | 5/1990 | Ichimura et al. | 430/273.1 |
| 5,053,310 | * 10/1991 | Platzer | 430/162 |
| 5,219,699 | * 6/1993 | Walls et al. | 430/156 |
| 5,262,270 | * 11/1993 | Walls | 430/156 |
| 5,275,907 | * 1/1994 | Walls | 430/157 |
| 5,316,892 | * 5/1994 | Walls et al. | 430/309 |
| 5,427,890 | 6/1995 | Suzuki et al. | 430/263 |
| 5,506,089 | 4/1996 | Gybin et al. | 430/287.1 |
| 5,534,381 | * 7/1996 | Ali et al. | 430/156 |
| 5,645,975 | * 7/1997 | Gybin et al. | 430/308 |

FOREIGN PATENT DOCUMENTS

| | | |
|---|---|---|
| 55-135834 | 10/1980 | (JP) . |
| 59-154442 | 9/1984 | (JP) . |
| 61-186955 | 8/1986 | (JP) . |

\* cited by examiner

*Primary Examiner*—John S. Chu
(74) *Attorney, Agent, or Firm*—Merchant & Gould P.C.

(57) ABSTRACT

Disclosed are photoresist compositions comprising a polymeric backbone and a quaternary heterocyclic pendant group, particularly usefull in the preparation of screen printing and sandblast etching photoresists. The pendant groups comprise furanyl substituted quaternary heterocyclic groups, as seen in the formula:

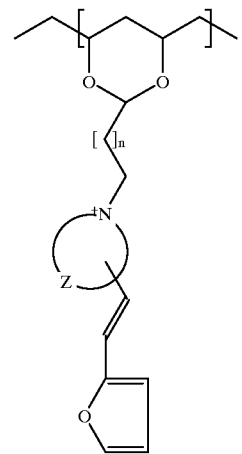

where n ranges from 0 to 4 and Z denotes the atoms necessary to complete a substituted or unsubstituted nitrogen containing heterocyclic ring.

18 Claims, No Drawings

PHOTOSENSITIVE RESIN COMPOSITION

CROSS-REFERENCE TO RELATED APPLICATION

This applications claims priority to U.S. Ser. No. 60/111,366, filed Dec. 8, 1998.

FIELD OF THE INVENTION

The invention relates to photoresist compositions comprising a polymeric backbone and a quaternary heterocyclic pendant group and other components, particularly useful in the preparation of screen printing and sandblast etching photoresists. The invention also relates to methods of preparing photocross-linkable polymeric systems which do not require purification steps.

BACKGROUND OF THE INVENTION

Photosensitive or photoreactive polymers are commonly used in coatings which have properties that can change when exposed to suitable radiation. Such a change in properties is usually a change in solubility and results in a sharp distinction between exposed and unexposed areas. Photocrosslinking and photoinitiated polymerization are commonly used to exploit the photosensitivity of materials. This invention relates to photocross-linking between ethylenically unsaturated sites. Exposure to light of the photosensitive or photoreactive material results in a solubility change and creation of the image in the exposed material. Most commonly, resist images are produced by solvent development of photoinduced cross-linking (negative processing). Photoresist polymer compositions must satisfy a number of physical property dependent requirements under practical working conditions. The most important, and most difficult, requirements to fulfill are image discrimination, thermal stability, ink resistance and etch resistance when exposed. For image discrimination, the developing solvent must remove the soluble portion of the exposed material without distorting or swelling the insoluble areas to give a sharp true image.

Exposure of the photopolymer to light generally provides energy necessary to cross-link adjacent polymeric molecules. In many instances, this provides for a three dimensional cross-linked polymer. For example, with sufficient exposure to light, a polymer having diazo units becomes hydrophobic. A variety of photo-chemical systems have been used in photoresist applications including cinnamates, chalcones, p-azidophenyls, azidophthalates, p-phenylene, bis(acrylates), and many others.

There are a number of examples in the art of photosensitive compounds which have pendant pyridinium groups. Mino et al., Japanese Laid Open Patent Application No. Showa 61-186955 (1986) and Toyofuku et al., Japanese Laid Open Patent Application No. Showa 59-154442 (1984) both disclose the use of a polyvinyl alcohol backbone with side groups of the formula:

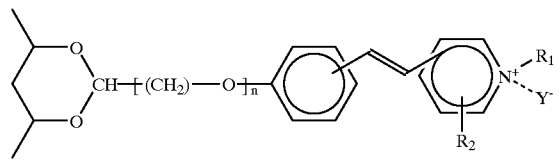

wherein $R_1$, $R_2$, n and Y are as defined in the reference.

Yanagi et al., Japanese Laid Open Patent Application No. Showa 55-135834 (1984) also teaches the use of side groups containing terminal substituted pyridinium groups, as shown in the formulae:

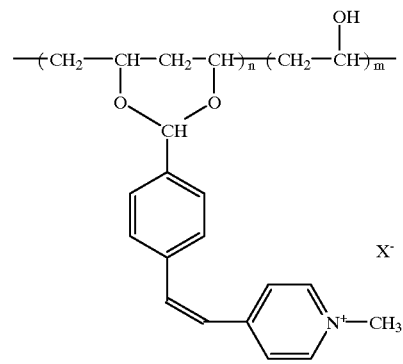

wherein n, m and X are as defined in the reference.

Yanagi also discloses the use of side chains with terminal styryl and substituted styryl groups, as shown in the formulae:

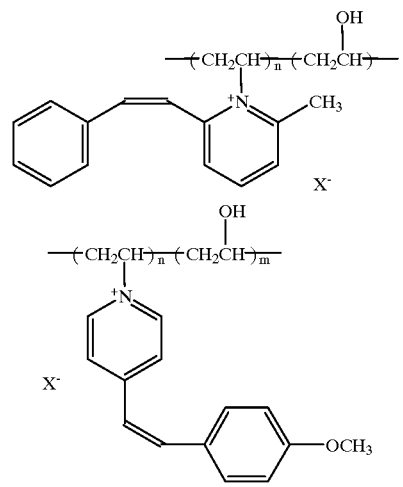

wherein n, m and X are as defined in the reference.

Yanagi continues by displaying a side chain with a terminal furanyl group, as shown here in the formula:

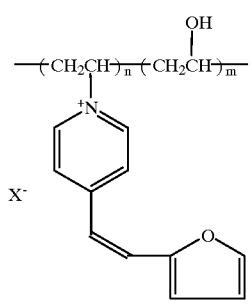

wherein n, m and X are as previously defined.

Ichimura et al., U.S. Pat. No. 4,925,770, also discloses the use of furanyl containing molecules. However, Ichimura teaches the inclusion of such a molecule freely in solution, rather than grafted to a backbone. Ichimura teaches a free molecule of the formula:

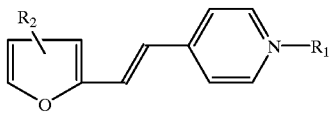

wherein $R_1$ and $R_2$ are as defined in the reference.

Engraving images on materials such as glass, metal and plastic traditionally involve the steps of first forming a resist layer containing an image and then sandblasting the entire surface. Any areas not covered by the resist are etched away to form an image while the protected areas remain intact. When imaging glass, a hydrofluoric acid treatment can substitute for sandblasting. In contrast, an aqueous solution of ferric chloride can be used if processing copper plate.

An example of this process is given by Suzuki et al., U.S. Pat. No. 5,427,890, who teach the use of a photosensitive laminate film to form the resist layer. The laminate film includes a water-soluble resin composition which exhibits photocrosslinkability. The areas exposed to light become insoluble in water while the protected portions remain water soluble. A water rinse is sufficient to remove the soluble portions to form the resist layer. While a number of possible photosensitive materials are known in the art, Suzuki is limited to the use of stilbazolium groups as the photosensitive moiety.

SUMMARY OF THE INVENTION

The present invention relates to photoresists based on a photocross-linkable polymer. The photocross-linkable polymer of the invention has a polymeric backbone and at least 0.1 mol-% of a quaternary heterocyclic pendant group grafted thereon and can be illustrated by the formula I:

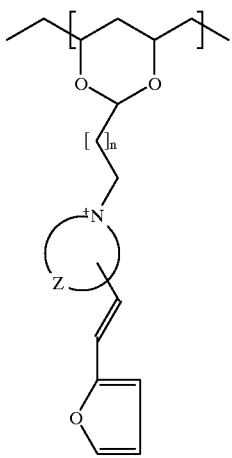

(I)

where n ranges from 0 to 4 and Z denotes the atoms necessary to complete a substituted or unsubstituted nitrogen containing heterocyclic ring.

A preferred aspect of the invention involves a photosensitive polymer having a polymeric backbone derived from polyvinyl alcohol with at least 0.1 mol-% of a furanyl substituted quaternary heterocyclic grafted thereon that can be illustrated by the formula II:

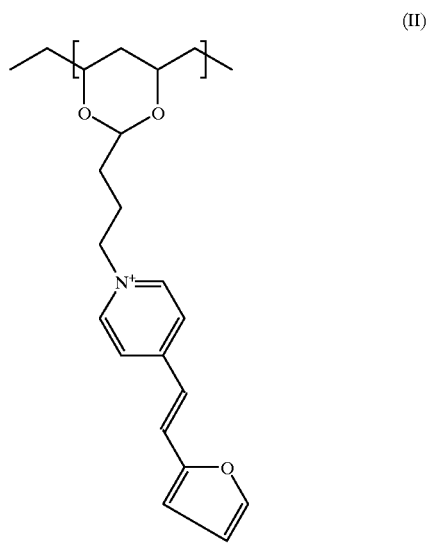

(II)

Another embodiment of the invention is found in a liquid photoresist composition that contains a liquid carrier and about 1 to 50 wt-% of a photosensitive polymer of formula (I), where n and Z are as previously defined. The invention is also found in a liquid photoresist composition utilizing a photosensitive polymer of formula (II).

Another aspect of the invention can be found in an aqueous screen printing composition having an aqueous carrier and about 1 to 50 wt-% of a photosensitive polymer of formula (I), where n and Z are as previously defined. The invention is also found in an aqueous screen printing composition utilizing a photosensitive polymer of formula (II).

Another aspect of the invention involves a sandblast photoresist composition having an aqueous carrier and about 1 to 50 wt-% of a photosensitive polymer of formula (I), where n and Z are as previously defined. The invention is also found in a sandblast photoresist composition utilizing a photosensitive polymer of formula (II).

Another aspect of the invention involves in a photosensitive resin composition that has an aqueous dispersion of solutions and emulsions including at least about 1 to 50 wt-% of a photosensitive polymer of formula (I), where n and Z are as previously defined; a water dispersible or hydrophobic polymer; and a photopolymerizable compound that has an ethylenically unsaturated group; and optionally includes a photopolymerization initiator; and a water soluble diazo compound.

Still another aspect of the invention involves in a photosensitive resin composition that has an aqueous dispersion of solutions and emulsions including at least about 1 to 50 wt-% of a photosensitive polymer of formula (II), where n and Z are as previously defined; a water dispersible or hydrophobic polymer; and a photopolymerizable compound that has an ethylenically unsaturated group; and optionally includes a photopolymerization initiator; and a water soluble diazo compound.

Creating the photosensitive polymers generally involves forming the photosensitive molecule and then grafting it onto the polyvinyl backbone. The molecule is created by starting with a commercially available diether alcohol, which is reacted with a leaving group containing compound ($R^3X$) in the presence of pyridine, resulting in a compound in which the $R^3$ group has been substituted onto the alcohol oxygen. In the next step, this molecule is reacted with methyl-substituted nitrogen heterocyclic to form an intermediate in which the methyl-substituted nitrogen heterocyclic replaces the R³O group. The reactions are illustrated in the Detailed Description section. Finally, the intermediate is reacted with furfural in the presence of piperidine to form the light sensitive pendant group.

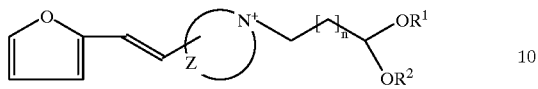

The linkage of the pendant group to the polymeric backbone can be discussed with reference to $R^1$ and $R^2$ in the above structural representation. The $OR^1$ and $OR^2$ groups react with adjacent hydroxyl groups on the polyvinyl alcohol backbone in the presence of an acid catalyst. The linkage to active sites on the polymeric backbone is largely dependent upon the particular structure of the backbone. A backbone derived from partially saponified poly(vinyl acetate) or poly(vinyl alcohol) will generally result in the linkage of the pendant moiety through one or two adjacent oxygen atoms along the backbone.

DETAILED DESCRIPTION OF THE INVENTION

The photosensitive polymeric material of the invention includes a polymeric backbone and a quaternary heterocyclic pendant group which includes a moiety having the formula:

In this formula, $R^1$ and $R^2$ are each independently substituted or unsubstituted linear or branched $C_{1-24}$ alkyl, aralkyl, and n is an integer ranging from 0 to about 4, in which alkyl has 1 to 4 carbon atoms, or $R^1$ and $R^2$ taken together can form a 5 to 7 member cyclic group. For example, $R^1$ and $R^2$ taken together can form, with the attached oxygens, a dioxane moiety. Z represents the atoms necessary to complete a substituted or unsubstituted nitrogen containing heterocyclic ring.

The linkage of the pendant group to the polymeric backbone can be discussed with reference to $R^1$ and $R^2$ in the above structural representation. The linkage to active sites on the polymeric backbone is largely dependent upon the particular structure of the backbone. A backbone derived from partially saponified poly(vinyl acetate) or poly(vinyl alcohol) will generally result in the linkage of the pendant moiety through one or two adjacent oxygen atoms along the backbone.

The photopolymers of the invention are more flexible, both in physical properties and in choice of actual pendant group structure. The linkage between the photosensitive ethylenic unsaturation and the polymeric backbone can provide a number of beneficial functions. In particular, surface active linkages can be used.

The nitrogen-containing heterocyclic ring may be any nitrogen-containing aromatic heterocyclic ring or multiple ring system. Representative, non-limiting examples of the aromatic heterocyclic ring include the following structures:

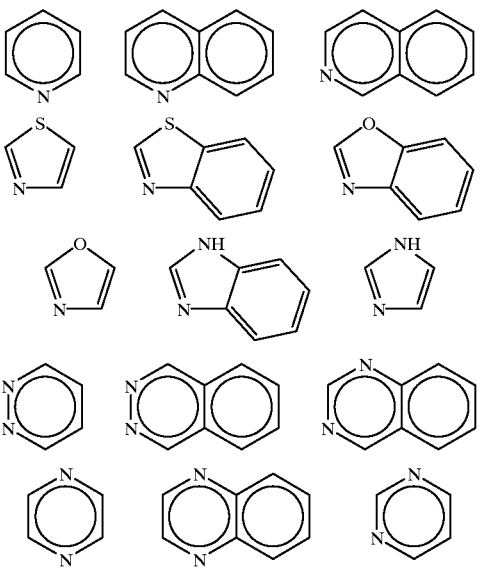

In addition to the structures indicated above, the aromatic heterocyclic rings may also include those rings which are substituted with an alkyl group, an alkoxy group, or a hydroxyl group.

Preparation of the Graftable Compound

The graftable compound of the invention can be prepared through the following representative synthesis:

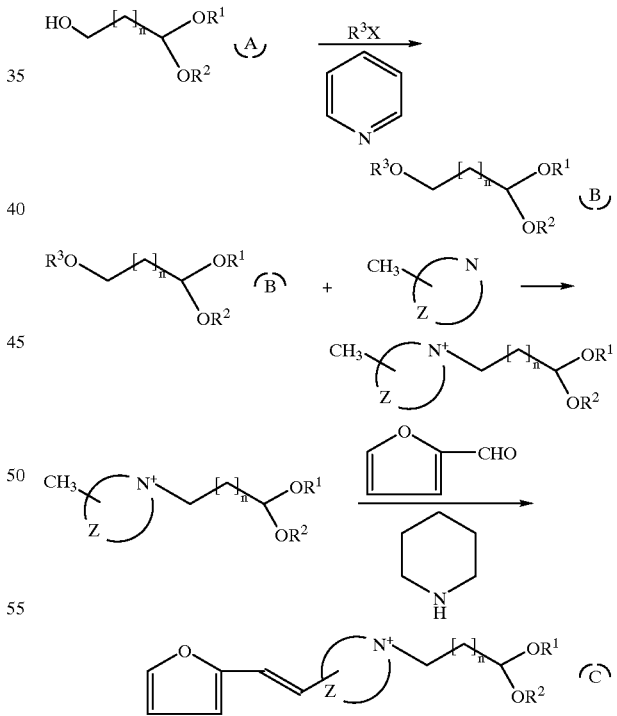

where n ranges from 0 to 4 and Z denotes the atoms necessary to complete a substituted or unsubstituted nitrogen containing heterocyclic ring.

In this representative synthesis, the starting material is a commercially available diether alcohol (formula A). In this formula, $R^1$ and $R^2$ are each independently substituted or unsubstituted linear or branched $C_{1-24}$ alkyl, aralkyl, and n is an integer ranging from 0 to about 4, in which alkyl has 1 to 4 carbon atoms, or $R^1$ and $R^2$ taken together can form a 5 to 7 member cyclic group. For example, $R^1$ and $R^2$ taken together can form, with the attached oxygens, a dioxane or dioxolane moiety.

This material is reacted with the compound represented as $R^3X$ in the presence of pyridine, resulting in a compound in which the $R^3$ group has been substituted onto the alcohol oxygen. This creates formula B. While X is a halogen, $R^3$ represents a group which can be a substituted or unsubstituted linear or branched $C_{1-24}$ alkyl, aryl, alkaryl, or tosyl. Preferably, $R^3$ is a tosyl group and X is Cl.

In the next step, formula B is reacted with a methyl-substituted nitrogen heterocyclic, such as, for example, 4-picoline to form an intermediate in which the 4-picoline replaces the $R^3O$ group. Finally, the intermediate is reacted with furfural in the presence of piperidine to form the pendant group (formula C).

Photopolymers can be prepared by grafting these groups onto a polymeric backbone. The photopolymers of the invention are created through the following representative synthesis:

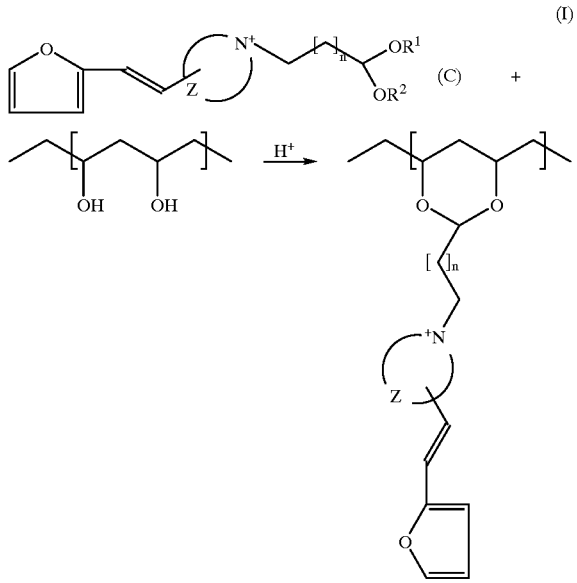

This synthesis clearly shows how the molecule is grafted, as a condensation reaction which readily takes place in the presence of an acidic catalyst. Consequently, the $OR^1$ and $OR^2$ groups react with adjacent hydroxyl groups on the polyvinyl alcohol backbone.

The polymeric backbone is preferably the result of the polymerization of substituted vinyl monomers, olefins, or acetylenes. Particularly usefull backbone polymers include film-forming vinyl polymer resins selected from the group consisting of vinyl alcohol polymers, vinyl acetate polymers, vinyl acetate/ethylene copolymers, vinyl acetate/acrylic acid copolymers, vinyl acetate/acrylic acid ester copolymers, acrylic acid ester polymers, acrylic acid/acrylic acid ester copolymers, styrene polymers, styrene/acrylic acid copolymers, styrene/acrylic acid ester copolymers, vinyl chloride polymers, vinylidene chloride polymers, vinyl acetate/methacrylic acid copolymers, vinyl acetate/methacrylic acid ester copolymers, styrene/butadiene copolymers, acrylonitrile/butadiene copolymers, copolymers of vinyl acetate, homo- and copolymers of vinyl pyridine, homo- and copolymers of dialkylaminoalkylmethacrylates, homo- and copolymers of alkylaminoalkymethacrylates, homo- and copolymers of dialkylaminoacrylates, homo- and copolymers of alkyaminoacrylates, homo- and copolymers of vinylimidazole and homo- copolymers of vinylsuccinimide.

The preferred polymeric backbone is more preferably derived from polyvinyl alcohol. Polyvinyl alcohol (PVOH), a polyhydroxy polymer having a polymethylene backbone with pendent hydroxy groups, is a water soluble synthetic resin. It is produced by the hydrolysis of polyvinyl acetate. The theoretical monomer

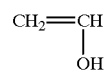

does not exist. Polyvinyl alcohol is one of the very few high molecular weight commercial polymers that is water soluble. It is commonly available as a dry solid and is available in granular or powdered form. PVOH grades include a "super" hydrolyzed form (99.3% plus removal of the acetate group), a fully hydrolyzed form (99%+removal of the acetate group), a form of intermediate hydrolysis (about 98 to 91% removal of acetate group), and a partly hydrolyzed (about 91% to 85% removal of the acetate group) polyvinyl alcohol.

The above-described pendant quaternary moiety is generally present in an amount of at least about 0.1 mol-% of the available active sites on the photopolymer, preferably about 0.1 to 20 mol-%, and more preferably about 0.5 to 10 mol-% of the polymer. Additional pendant groups may also be present in the photopolymer such as acetate or acetal residues. These optional pendant groups may be present at up to about 50 mol-% of the polymer.

The photopolymers useful in the photoresists of the invention can have a molecular weight of about 5,000 to 1,000,000. At the lower end of the range, the photopolymers may actually be oligomers. At a molecular weight of about 1,000,000, the photopolymers may be cast as films from a melt of about 100% solids. Of course, if the molecular weight is too low, polymerization and photocross-linking may be ineffective to render the material insoluble after imaging and developing. If the molecular weight is too great, the viscosity of an aqueous solution or resin melt may be too high for handling. More preferably, the molecular weight ranges from about 20,000 to 500,000. This range is generally more forgiving, i.e., the formulator has the opportunity to vary composition proportions to balance viscosity, solubility rate, pliability, ductility, and other properties. Most preferably, the polymer has a molecular weight of about 40,000 to 200,000. This range generally is the most versatile and economically viable.

Of course, the ordinary practitioner may desire or need to formulate the photopolymer to meet specific needs. The viscosity of the photoresist composition generally results from a balance of % solids in a solution or dispersion and the molecular weight of the polymer. Increasing either the % solids or the molecular weight generally results in increased viscosity. In addition, as the molecular weight increases, it may be necessary to decrease the cross-linkability of the photopolymer so it remains soluble or dispersible in the developer. High viscosity dispersions may be useful to achieve thicker photoresist films and to reduce their cold flow and tack. The incorporation of lower molecular weight polymers or oligomers either as the source of polymers or as a reactive diluent may render the photoresist or stencil harder and more brittle, which can be desirable to enhance performance under certain conditions.

The photopolymers of our invention can be used in various forms to provide photosensitive screens, masks, stencils, and the like for use in negative photoimaging systems. These photoimaging systems develop latent images prior to developing and are typically non-silver halide systems. The photopolymer may be used as a flexible resist or printing plate. The photopolymers are preferably used as a liquid photoresist composition having a liquid carrier and about 0.1 to 50 wt-% of at least one photosensitive polymer (or photopolymer) of our invention. Preferably, the liquid composition includes the liquid carrier and about 1 to 50 wt-% of the photopolymer, and more preferably about 5 to 20 wt-% of the photopolymer.

For practical use, two or more different photopolymers with equal or different amounts of photoactive units in them can be used at the same time in a composition to achieve best performance. For example, photopolymers derived from polyvinylpyridine and polyvinylalcohol can be used in the same composition. To achieve best cross-linking in between polymers, photoactive sites in the two or more polymers should have similar structure and have similar or equal photoresponse. The synthetic approach of our invention to the photoactive precursors of the polymers is units of similar or equal photoproperties. Another way of achieving similar results in a photoresist is to incorporate two or more different photoactive pendant groups in a polymer chain.

The liquid composition is generally a solution or a dispersion of the photopolymer in the liquid carrier. This can take the form of an aqueous solution, an emulsion, an organic solution, or other dispersions or solutions used by those of ordinary skill in the art. The liquid carrier may be water or otherwise aqueous in nature, e.g., an aqueous acidic solution, or it may be an organic solvent or an organic liquid bulk phase in an emulsion or dispersion.

Other components which do not detrimentally affect the pH and photosensitive nature of the photopolymer to an extent sufficient to defeat its operability can be compounded or added to the material of such a photoresist film. Optional components of the photoresist film may include plasticizers, sensitizers, photocross-linking agents, surfactants, defoarming agents, photoinitiators, fillers, reinforcing media, pigments or dyes, antioxidants, and other materials which impart desired properties to the photosensitive material of our invention. Further, the photoresist film can take the form of a screen printing stencil if applied to a screen mesh useful in such operations.

The photoresist composition can contain virtually any plasticizer that is compatible with the photo cross-linkable polymer composition and any film-forming binder polymeric composition, in the aqueous suspension. Both monomeric and polymeric plasticizers can be used in the resist composition. Monomeric plasticizers are typically plasticizers comprising small molecules having a molecular weight of less than about 1,000. Polymeric plasticizers are typically polymeric compounds commonly with molecular weights greater than about 1,000. Typical monomeric plasticizers include dialkyl adipates, dialkyl acetates, dialkyl benzoates, dialkyl citrates, dialkyl derivatives of phthalic anhydride and isophthalic anhydride, alkyl stearates, dialkyl terephthalates, trialkyl esters of trimelitic anhydride, and the like. Polymeric plasticizers include the various polyglycols and derivatives thereof, epoxy derivatives of stearate esters or phthalate esters, and polyester plasticizers such as SANTI-CIZER™ and PARAPLEX™ plasticizers.

Sensitizers commonly used in photopolymerizable resist compositions are monomers having photosensitive ethylenically unsaturated groups such as vinyl, acryloyl, methacryloyl, alkyl, vinyl ether, acrylamide, or other groups or prepolymers thereof having an average degree of unsaturation of about 1 to 5. Examples of sensitizers having a single ethylenically unsaturated group include acrylamide, acrylic acid, methacrylic acid, methyl methacrylate, and methylol acrylamide. Preferred polyfunctional sensitizers have two or more photosensitive ethylenically unsaturated groups including sensitizers such as pentaerytritol triacrylate, pentaerythritol tetraacrylate, pentaerythritol trimethacrylate, pentaerytbritol tetramethacrylate, 2,2,-dibromo methyl, 1,3-propane diacrylate, triallyl isocyanurate, N,N'-methylene bis-acrylamide, and prepolymers thereof. The most preferred sensitizer is pentaerythritol triacrylate.

The composition of the present invention can further include a diazo resin complex photocross-linking agent. As the diazo resin, water-soluble diazo resins formed by condensing diazotization products of diphenylamines such as p-aminodiphenylamine, 4-amino-4'-methyldiphenylamine, 4-amino-4'-ethyldiphenylamine, 4-amino-4'-methoxydiphenylamine, 4-amine-4'-chlorodiphenylamine and 4-amino-4'-nitrodiphenylamine with aldehydes such as p-formaldehyde, acetaldehyde, propionaldehyde and n-butylaldehyde can be used. The complexes can be formed between the above-discussed condensation products and sulfuric acid salts, phosphoric acid salts and zinc chloride double salts. The photocross-linking agent can be used in an amount of up to 20 parts per 100 parts of the light-sensitive heterocyclic quaternary group-added polymer.

Polymerization reaction initiators suitable for use in the invention are those materials which will easily generate free radicals upon exposure to heat or ultraviolet radiation. Examples of these initiators include benzoinalkyl ethers, Michler's ketone, ditertiary butyl peroxide, dibenzothiazolyl-disulfide, dibromoacetophenone, anthraquinone, azobisisobutyronitrile, and the like. In a similar fashion, the ethylenically unsaturated resists of this invention can contain optional functional compounds such as defoamers, surfactants, dyes, antioxidants, or other additives commonly used in this art.

Additional optional additives that can be used in the practice of this invention include surfactants used to increase the compatibility of the aqueous resist composition with the surface of the object and to promote an even coating. A defoamer can be used to ensure that the layer of resist is free of small bubbles and other foamed species. A dye can be used to permit visualization of the position and approximate thickness of the resist composition. An antioxidant can be used for the preservation of the concentrations of the cross-linking activator.

The photoresist film comprising the photopolymer may be formed in any manner known to those skilled in the art, including spraying, casting, reverse or roll coating, dipping, and doctor blading. Other methods of formation and photosensitive uses beyond those specifically disclosed herein will be recognized by the practitioner. These methods and uses of the invention are intended to be within the scope of the claims appended to the end of this specification.

EXAMPLES

The following specific examples which contain the best mode known to the inventors further illustrate the invention. These examples are merely illustrative of the invention and are not intended to limit its scope.

Experimental Synthesis of Compounds

The starting material is 2-(3-hydroxypropyl)-5,5-dimethyl-1,3-dioxane (Formula I), which is shown below and is made by the procedure described by J. C. Stowell and M. A. Polito (J. Org. Chem., 57,2195–6, 1992):

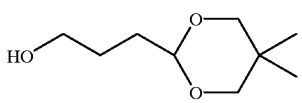

2-[1-(4-toluenesulfonyloxy)propyl]-5,5-dimethyl-1,3-dioxane

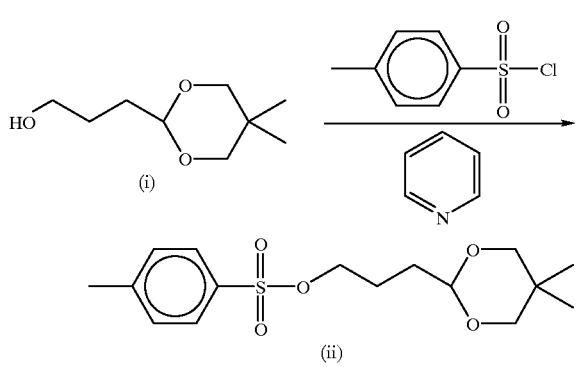

As shown above, 12.1 g of 2-(3-hydroxypropyl)-5,5-dimethyl-1,3-dioxane (Formula i) and 14.7 g of toluenesulfonylchloride were mixed and cooled to about 0 to 5° C. and then 15 ml of pyridine were added slowly while maintaining the temperature between about 20 and 25° C. The reaction mixture was stirred for another 4 hours and poured onto 100 g of ice and slurry neutralized using concentrated HCl. The product (white crystals) were collected by filtration, dried and then recrystallized from ethylacetate/hexane.

N-[3-(5,5-dimethyl-1,3-dioxane-2-yl)-propyl]-4-[2-2(furylvinyl)]pyridinium p-toluenesulfonate

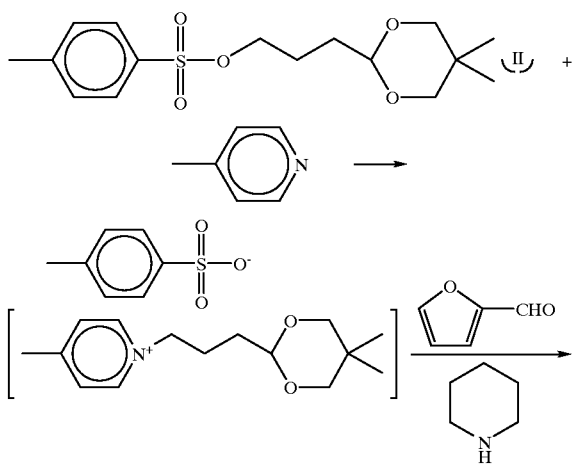

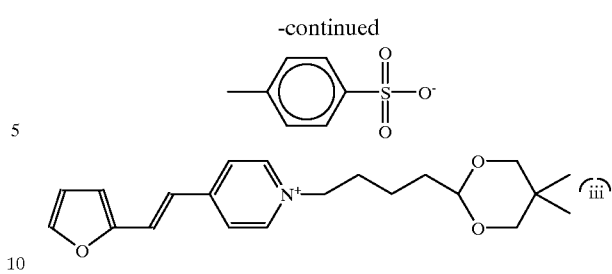

As shown above, 32.8 g of Formula ii and 10 ml of 4-picoline were mixed in 20 ml of ethanol and heated at 60° C. for 24 hours. Then, 15 ml of furfural were added to the mix followed by 1 ml of piperidine. Heating and agitation were continued for another 8 hours and then the reaction mixture was poured into 120 ml of a 1:1 mixture of acetone and ethylacetate. The product (Formula iii) was filtered, washed with cold acetone/ethylacetate and air-dried. UTV spectroscopy revealed a $\lambda_{max}$ of 380–381 nm.

Creation of Substituted Polymer #1

45 g of polyvinyl alcohol were dissolved in 300 g of water with application of heat. 6.2 g of Formula iii were added to the solution followed by 3.6 g of concentrated HCl. The reaction mixture was stirred at 80° C. for 1 hour, cooled and was neutralized with ammonia. Analysis of the sample shows 1.35 mole percent of Formula II present in the polymer.

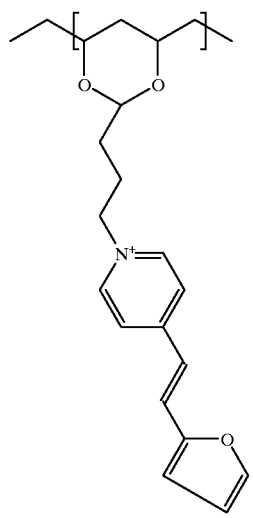

Use of Substituted Polymer #1

20 g of the substituted polymer was combined with 80 g of polyvinyl acetate, and the mix was applied on several nylon screens (110 mesh). After drying the screens were exposed to a metal halide light and a fluorescent light. After developing with tap water, all screens showed sharp and strong negative images.

Creation of Substituted Polymer #2

90 g of polyvinyl alcohol were dissolved in 600 g of water with application of heat. 4.72 g of concentrated HCl and 20 g of ion exchange resin (Gr, Cl-form) were added to the resulting solution at 80° C. followed by the addition of 12.54 g of Formula iii to the solution. The reaction mixture was stirred at 80° C. for 2.5 hours, filtered hot and was neutralized with ammonia water. Sample precipitated with acetone was analyzed by UV/vis and showed 1.37 mole percent of the light sensitive salt grafted to the polyvinyl alcohol backbone.

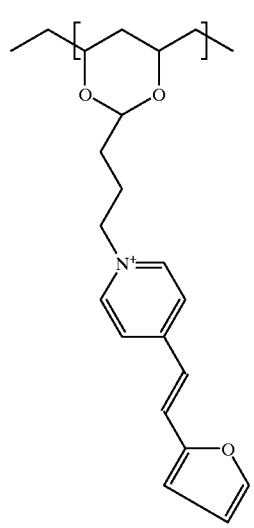

(II)

Sandblast Photoresist Formulations

A number of different formulations have been used for creating photoresists suitable for use in etching via sandblasting. In the representative formulations shown here, the term "FASM" represents formula (II).

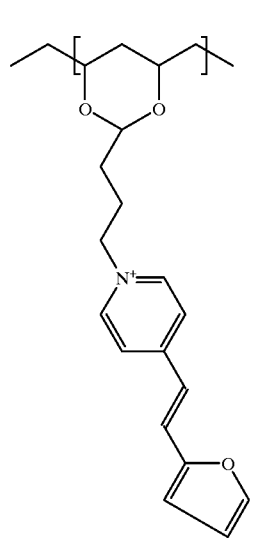

(II)

Example #1

| FASM | 25 wt-% |
|---|---|
| polyvinyl acetate emulsion | 65 wt % |

-continued

| dibutyl phthalate | 8.7 wt % |
|---|---|
| 30% pigment solution | 1 wt % |
| nonionic surfactant | 0.3 wt % |

Example #2

| FASM | 35 wt % |
|---|---|
| acrylic acid ester emulsion | 25 wt % |
| polyvinyl acetate emulsion | 32.3 wt % |
| benzoate ester plasticizer | 7 wt % |
| pigment solution | 0.5 wt % |
| anionic surfactant | 0.2 wt % |

Example #3

| FASM | 25 wt % |
|---|---|
| polyvinyl acetate emulsion | 63.1 wt % |
| phosphate ester plasticizer | 10 wt % |
| pigment solution | 0.8 wt % |
| anionic surfactant | 0.3 wt % |
| nonionic surfactant | 0.3 wt % |
| paradiazodiphenylamine/formaldehyde sulfate condensate resin (diazo resin) | 0.5 wt % |

Example #4

| FASM | 20 wt % |
|---|---|
| polyvinyl acetate emulsion | 58.65 wt % |
| polyvinyl alcohol | 10 wt % |
| acrylate oligomer | 7 wt % |
| acrylate monomer | 3 wt % |
| free radical polymerization initiator | 0.3 wt % |
| diazo resins | 0.25 wt % |
| pigment solution | 0.5 wt % |
| nonionic surfactant | 0.3 wt % |

Test Results

The above compositions, Examples 1–4, were applied on a polyester mesh screen, dried and then exposed to actinic light through a negative artwork, washed with city water to produce a stencil having a sharp image.

The foregoing description, examples and data are illustrative of the invention described herein, and they should not be construed to unduly the limit the scope of the invention or the claims, since many embodiments and variations can be made while remaining within the spirit and scope of the invention. The invention resides wholly in the claims hereinafter appended.

What is claimed is:

1. A photosensitive polymer comprising a polymeric backbone derived from polyvinyl alcohol with at least 0.1 mol-% of a furanyl quaternary heterocyclic group grafted thereon, the polymer having the formula:

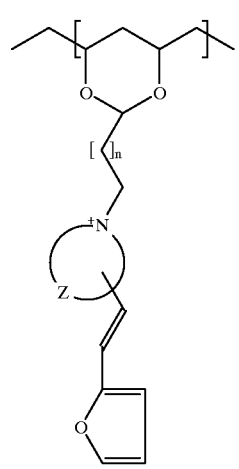

(I)

where n ranges from 0 to 4, and Z denotes the atoms necessary to complete a substituted or unsubstituted nitrogen containing heterocyclic ring.

2. The polymer of claim 1 wherein Z represents a pyridiniumn residue.

3. The polymer of claim 1 wherein n is equal to 2.

4. A photosensitive polymer comprising a polymeric backbone derived from polyvinyl alcohol with at least 0.1 mol-% of a furanyl quaternary heterocyclic group grafted thereon, the polymer having the formula:

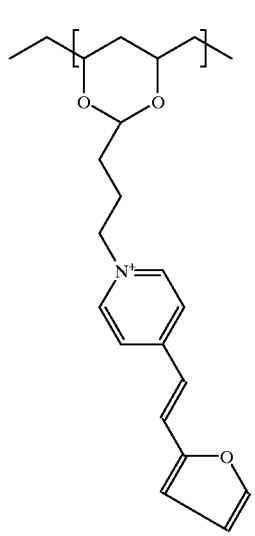

(II)

5. A liquid photoresist composition comprising:

a) a liquid carrier; and b) about 1 to 50 wt-% of a photosensitive polymer comprising a polymeric backbone derived from polyvinyl alcohol with at least 0.1 mol-% of a furanyl quaternary heterocyclic group grafted thereon, the polymer having the formula:

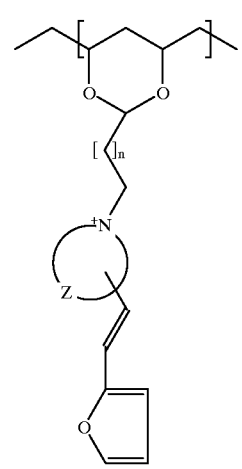

(I)

where n ranges from 0 to 4 and Z denotes the atoms necessary to complete a substituted or unsubstituted nitrogen containing heterocyclic ring.

6. The composition of claim 5 wherein Z represents a pyridinium residue.

7. The composition of claim 5 wherein n is equal to 2.

8. A liquid photoresist composition comprising:

a) a liquid carrier; and b) about 1 to 50 wt-% of a photosensitive polymer comprising a polymeric backbone derived from polyvinyl alcohol with at least 0.1 mol-% of a furanyl quaternary heterocyclic group grafted thereon, the polymer having the formula:

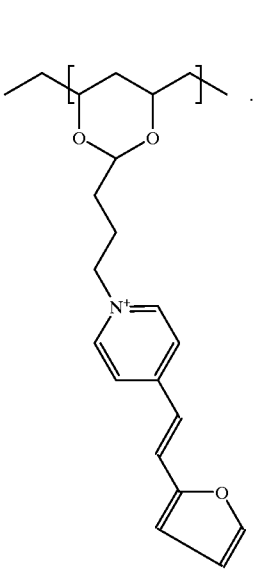

(II)

9. An aqueous screen printing composition comprising:

a) an aqueous carrier; and b) about 1 to 50 wt-% of a photosensitive polymer comprising a polymeric backbone derived from polyvinyl alcohol with at least 0.1 mol-% of a furanyl quaternary heterocyclic group grafted thereon, the polymer having the formula:

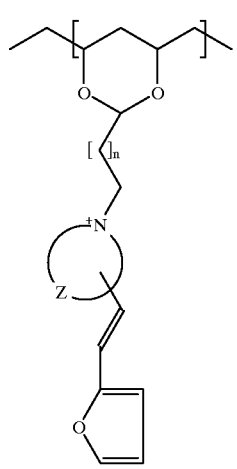

(I)

where n ranges from 0 to 4 and Z denotes the atoms necessary to complete a substituted or unsubstituted nitrogen containing heterocyclic ring.

10. The composition of claim 9 wherein Z represents a pyridinium residue.

11. The composition of claim 9 wherein n is equal to 2.

12. An aqueous screen printing composition comprising:

a) an aqueous carrier; and b) about 1 to 50 wt-% of a photosensitive polymer comprising a polymeric backbone derived from polyvinyl alcohol with at least 0.1 mol-% of a furanyl quaternary heterocyclic group grafted thereon, the polymer having the formula:

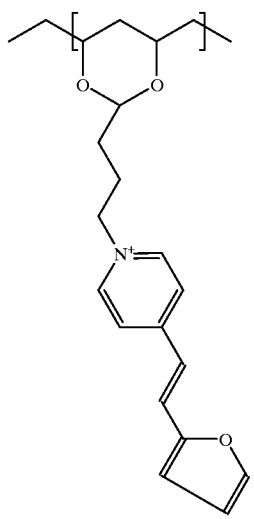

(II)

13. A sandblast photoresist composition comprising:

a) an aqueous carrier; and b) about 1 to 50 wt-% of a photosensitive polymer comprising a polymeric backbone derived from polyvinyl alcohol with at least 0.1 mol-% of a furanyl quaternary heterocyclic group grafted thereon, the polymer having the formula:

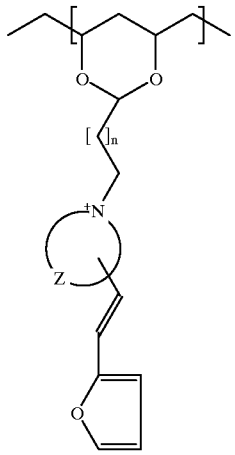

(I)

where n ranges from 0 to 4 and Z denotes the atoms necessary to complete a substituted or unsubstituted nitrogen containing heterocyclic ring.

14. The composition of claim 13 wherein Z represents a pyridinium residue.

15. The composition of claim 13 wherein n is equal to 2.

16. A sandblast photoresist composition comprising:

a) an aqueous carrier; and b) about 1 to 50 wt-% of a photosensitive polymer comprising a polymeric backbone derived from polyvinyl alcohol with at least 0.1 mol-% of a furanyl quaternary heterocyclic group grafted thereon, the polymer having the formula:

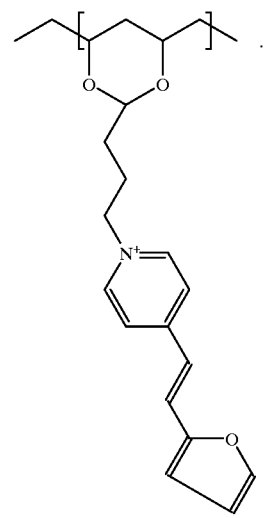

(II)

17. A photosensitive resin composition comprising an aqueous dispersion of solutions and emulsions comprising at least components (a), (b) and (c) of the following components:

(a) about 1 to 50 wt-%/ of a photosensitive polymer comprising a polymeric backbone derived from polyvinyl alcohol with at least 0.1 mol-% of a furanyl quaternary heterocyclic group grafted thereon, the polymer having the formula:

(I)

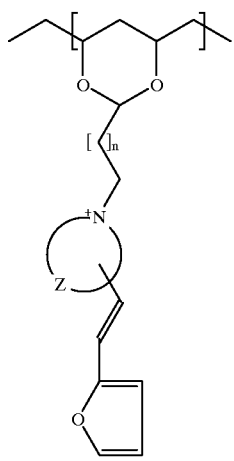

where n ranges from 0 to 4, Z denotes the atoms necessary to complete a substituted or unsubstituted nitrogen containing heterocyclic ring and the polymer has a molecular weight of about 5,000 to 1,000,000;

(b) a water dispersible or hydrophobic polymer;
(c) a photopolymerizable compound that has an ethylenically unsaturated group;
(d) a photopolymerization initiator; and
(e) a water soluble diazo compound.

18. A photosensitive resin composition comprising an aqueous dispersion of solutions and emulsions comprising at least components (a), (b) and (c) of the following components:

(a) about 1 to 50 wt-% of a photosensitive polymer comprising a polymeric backbone derived from polyvinyl alcohol with at least 0.1 mol-% of a furanyl quaternary heterocyclic group grafted thereon, the polymer having the formula:

(II)

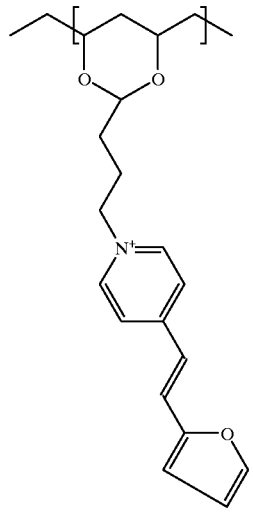

wherein the polymer has a molecular weight of about 5,000 to 1,000,000;

(b) a water dispersible or hydrophobic polymer;
(c) a photopolymerizable compound that has an ethylenically unsaturated group;
(d) a photopolymerization initiator; and
(e) a water soluble diazo compound.

* * * * *